United States Patent [19]
Siek

[11] Patent Number: 5,866,928
[45] Date of Patent: Feb. 2, 1999

[54] SINGLE DIGIT LINE WITH CELL CONTACT INTERCONNECT

[75] Inventor: David D. Siek, Boise, Id.

[73] Assignee: Micron Technology, Inc., Boise, Id.

[21] Appl. No.: 671,315

[22] Filed: Jul. 16, 1996

[51] Int. Cl.$^6$ .......................... H01L 27/108; H01L 29/76; H01L 29/94; H01L 31/119
[52] U.S. Cl. .......................... 257/296; 257/390; 257/905; 257/906; 257/907; 365/69; 365/72
[58] Field of Search .................... 257/296, 370, 257/905, 906, 907; 365/72, 69

[56] References Cited

U.S. PATENT DOCUMENTS

| | | |
|---|---|---|
| 4,763,178 | 8/1988 | Sakui et al. . |
| 4,800,525 | 1/1989 | Shah et al. .................... 365/72 |
| 5,025,294 | 6/1991 | Ema . |
| 5,107,459 | 4/1992 | Chu et al. .................... 365/63 |
| 5,159,415 | 10/1992 | Min . |
| 5,698,879 | 12/1997 | Aritome et al. .................... 257/315 |

Primary Examiner—Ngân V. Ngô
Attorney, Agent, or Firm—Schwegman, Lundberg, Woessner & Kluth, P.A.

[57] ABSTRACT

An integrated memory circuit comprises a plurality of memory cells and access transistors; and a digit line comprising conductive tabs extending from at least one side of a conductive digit line. The use of one digit line allows for a reduction in internal noise and coupling between digit line pairs. The use of one digit line also allows for a reduction in array size.

20 Claims, 14 Drawing Sheets

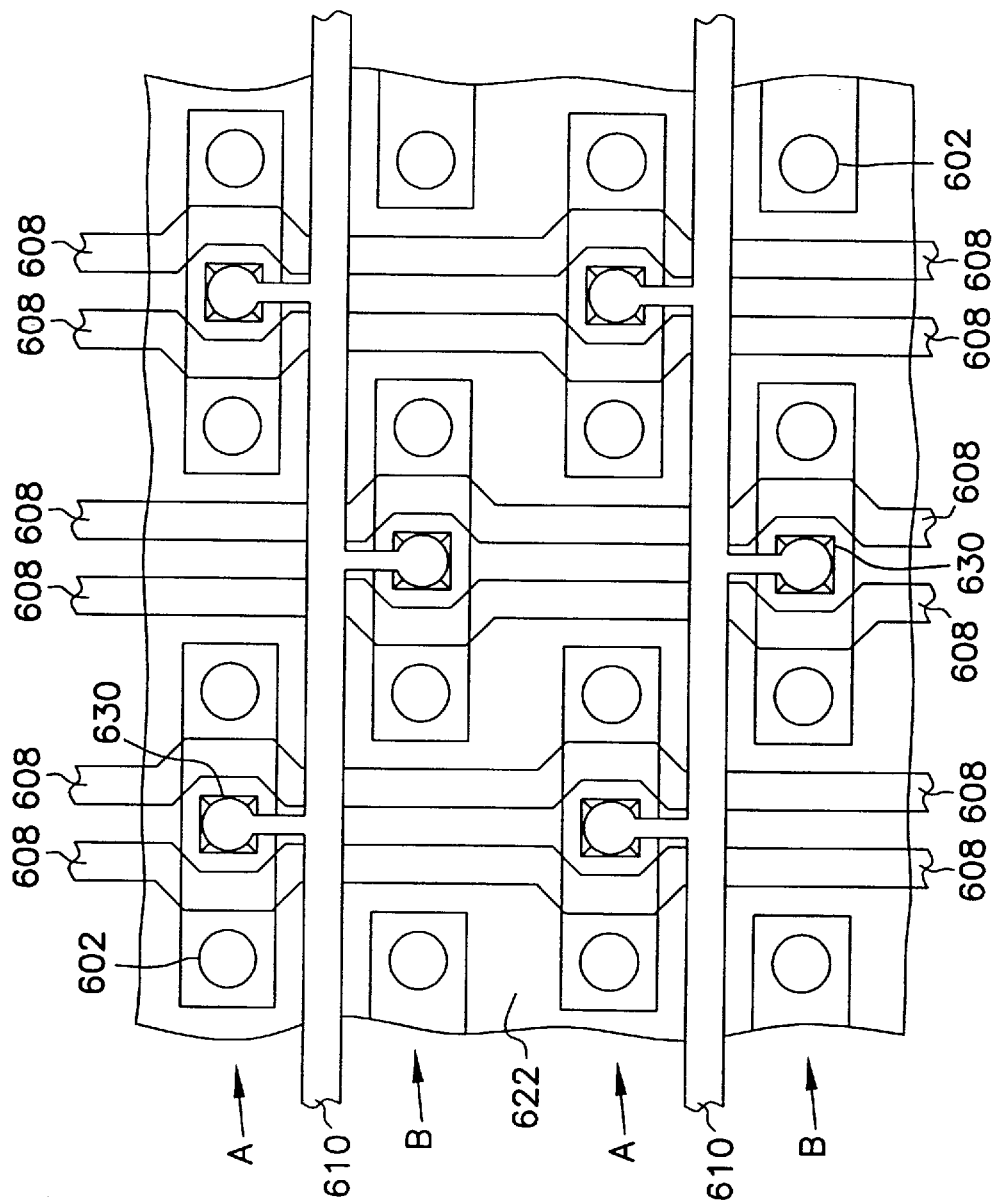

SINGLE DIGIT LINE WITH CELL CONTACT INTERCONNECT

FIELD OF THE INVENTION

The present invention relates to semiconductor integrated circuits and, more particularly, to implementation of dynamic random access memories (DRAMs) having single digit lines.

BACKGROUND OF THE INVENTION

Integrated circuit memories have become increasingly dense due to the need for increased memory storage. While fabrication techniques and design options have been fairly successful in maintaining steady increases in memory storage from design generation to generation, the need for new highly-populated circuits continues.

A dynamic random access memory (DRAM) device comprises an arrangement of individual memory cells. Each memory cell includes a capacitor capable of holding data as an electrical charge and an access transistor for accessing the charge stored on the capacitor. The charge is referred to as a data bit and its presence or absence on a storage capacitor produces either a high voltage or a low voltage, thereby representing data in a binary fashion. A high voltage corresponds to a "1" (i.e., a charged capacitor) and a low voltage corresponds to a "0" (i.e., an uncharged capacitor).

Data can be either stored to the memory cells during a write mode, or data may be retrieved from the memory cells during a read mode. The data is transmitted on signal lines, referred to as bit lines, or digit lines, which are connected to input/output (I/O) lines through field-effect transistors (FETs) used as switching devices. In conventional DRAM architecture, a data bit's true logic state is available on an I/O line and its complementary logic state is available on an I/O complement line. Thus, each conventional memory cell has two associated digit lines: digit and digit complement. The digit line is coupled directly to a source/drain region of an access transistor for a particular memory cell.

Typically, memory cells are arranged in an array and each cell has an address identifying its location in the array. The array is a configuration of intersecting rows and columns, and a memory cell is associated with each intersection. In order to read from, or write to, a cell, the particular cell in question must be selected, or addressed. The address for the selected cell is represented by input signals to a row decoder and to a column decoder. The row decoder activates a word line in response to the row address. The selected word line activates the access transistors for each of the memory cells in communication with the selected word line. The column decoder selects a digit line pair in response to the column address. For a read operation, the selected word line activates the access transistors for a given row address, and data is latched to a digit line.

Conventional dynamic memories use memory cells fabricated as capacitors in an integrated circuit to store data. That is, a logical "1" is stored as a charge on the capacitor and the capacitor is discharged for a logical "0". The pairs of digit lines are fabricated as metal, or silicided/polycided polysilicon, lines on the integrated circuit and connected to the memory cells for transmitting data stored in the memory cells. Sense amplifiers are utilized to sense small voltage differentials between a digit line and its complement. The sense amplifiers drive the digit lines to full power supply rails for either reading the memory cells, or writing thereto.

Although unique fabrication techniques and processes have been developed to reduce the size of the memory cells and access circuitry, the physical spacing requirements for the digit line architecture create a barrier to maximizing the available die area. That is, the reductions in memory cell size cannot be fully exploited due to the use of digit line pairs to read/write to a memory cell. Each individual digit line is highly capacitive, due to the large quantity of attached memory bits, the length of the line, and its proximity to other features. This capacitance dictates the design parameters of die circuitry. These problems are compounded due to the use of digit line pairs.

In the past, open digit line array architecture was most commonly used for DRAM circuitry, as shown in prior art FIG. 1. Such architecture is characterized by a memory cell located at each intersection between a word line and a digit line, or digit line complement. This type of architecture increases the chip density. However, several problems prevent such architecture from meeting the needs of highly dense ICs. Such problems include coupling between digit lines and high internal noise. Coupling between adjacent lines is inversely proportional to their spacing. As devices become smaller, the coupling problem becomes more pronounced.

Referring to prior art FIG. 1, a portion of a conventional dynamic memory access circuitry is described, showing an open digit line architecture. Memory arrays 100 have a plurality of memory cells 102, which are fabricated as capacitors having one capacitive plate connected to a reference voltage, or ground, at 104 and the other node connected to an access transistor 106. A typical reference voltage is one-half of the power supply voltage (Vcc). Each access transistor is a n-type transistor having its gate connected to a word line 108.

Digit lines 110 are each connected to a line of access transistors 106 and memory cells 102. When access transistors 106 are selectively activated, the charge stored on the corresponding memory cell 102 is coupled to the corresponding digit line 110. N-type isolation transistors 112 and 114 are used to selectively isolate digit lines 110 from the sense amplifiers 118 and bias circuitry. Bias circuits 116 are used to equalize the nodes of sense amplifiers 118 to the same voltage. The sense amplifiers 118 read the voltage difference between a pair of digit lines 110 to determine the logic of a memory cell 102. For example, a digit line 110 pair is shown in FIG. 1 as the digit line in column "A" and the digit line in column "B."

Alternatively, a folded digit line architecture was designed to improve noise immunity of such devices. Prior art FIG. 2 illustrates a portion of a memory array 200 having a folded digit line architecture. Folded digit line architecture is characterized by a memory cell 202 located at every other digit line 210/word line 208 intersection. A memory array 200 has a plurality of memory cells 202 which are fabricated as capacitors having one capacitive plate connected to a reference voltage, or ground, at 204 and having the other node connected to an access transistor 206. A typical reference voltage is one-half of the power supply voltage (Vcc). Each access transistor 206 is a n-type transistor having its gate connected to a word line 208(0)–(n).

Digit lines 210 are connected to access transistors 206 and memory cells 202. When access transistors 206 are selectively activated, the charge stored on the corresponding memory cell 202 is coupled to the digit line 210. The sensing implementation and other related components are similar to those described in prior art FIG. 1. N-type isolation transistors 212 and 214 are used to selectively isolate digit lines 210 from the sense amplifier 218 and bias circuitry 216. Bias circuit 216 is used to equalize the nodes of the sense amplifier 218 to the same voltage. The sense amplifier 218 reads the voltage difference between a pair of digit lines 210. The digit line 210 pair for any of the memory cells 204 shown in FIG. 2 is the two digit lines 210 in columns "A" and "B."

This type of architecture does not provide the same degree of packing density seen in the open digit line architecture described above. Its packing density is approximately twenty-five-percent lower than in the open digit line architecture. However, noise immunity of the integrated circuit is improved using folded digit line architecture over the open digit line architecture.

Plan views of the open digit line architecture and the folded digit line architecture are shown, respectively, in prior art FIGS. 3 and 4. FIG. 3 shows a memory cell 302 located at each intersection between a word line 308 and a digit line 310. Digit lines 310 run perpendicular to the word lines 308. Digit line interconnects 330 connect underlying source/drain regions of access transistors to digit lines 310.

FIG. 4 shows a memory cell 402 located at every other intersection between a word line 408 and a digit line 410. Digit lines 410 run perpendicular to the word lines 408. Digit lines 410 make connections to underlying source/drain regions of access transistors at interconnects 430.

While the layout of a folded bit architecture of FIG. 4 is not as efficient as that in FIG. 3, the noise immunity of the circuit is improved, over the open bit architecture of FIG. 3. The continued decrease in device size makes using an open digit line architecture, such as that in FIG. 3, problematic, due to coupling between digit line 310 pairs. Folded digit line architecture does not perfect such coupling problems, however. Recently, the trend in fabricating integrated circuit memories includes twisting adjacent digit line pairs to improve signal-to-noise characteristics. Such twisting is undesired because it occupies valuable silicon area. As devices are becoming more dense, silicon area is becoming more scarce.

For the reasons stated above, and for other reasons stated below which will become apparent to those skilled in the art upon reading and understanding the present specification, there is a need in the art for a DRAM architecture, having a higher packing density, which allows for more densely populated memories, and less coupling between digit lines. This must be accomplished while maintaining, or lowering, the noise immunity present in the folded digit line architecture.

SUMMARY OF THE INVENTION

In one embodiment of the invention, an integrated circuit memory device has a digit line formed in field oxide between adjacent active areas, in an integrated circuit memory. A plurality of conductive tabs extend from opposite sides of the digit line. The conductive tabs can be orthogonal to the digit line and are comprised of metal, or polysilicon. The tabs connect underlying access transistor source/drain regions to the digit line at interconnects. In further embodiments of the invention, the conductive tabs are formed at an angle with respect to the digit line. In further embodiments of the invention, the conductive tabs are formed at an angle with respect to the digit line.

In a second embodiment of the invention, an integrated circuit memory device has a digit line formed over active areas of the device, in an integrated circuit memory. A plurality of conductive tabs extend from one side of the digit line. The conductive tabs can be orthogonal to the digit line and are comprised of metal, or polysilicon. The tabs connect underlying access transistor source/drain regions to the digit line at interconnects. Interconnects are also made to the digit line itself, to connect transistor source/drain regions beneath the digit line. In further embodiments of the invention, the conductive tabs are formed at an angle with respect to the digit line.

In both embodiments of the invention, the conductive tabs can be formed in a variety of shapes, without departing from the invention. For example, the conductive tabs can be: rectangular in shape, tapered in shape, or rounded in shape.

Furthermore, in both embodiments of the invention, the digit lines are formed, having a spacing of two feature sizes in a first direction. A feature is defined as an access transistor and its associated memory cells. Memory cells are formed, having a spacing of one feature size in the first direction and a spacing of one-half feature size in a second direction. The second direction is orthogonal to the first direction in the plane of the integrated circuit memory. Conductive tabs, extending from the digit line, are formed, having a spacing of one feature size in the first direction and a spacing of two feature sizes in the second direction.

Another way of defining the invention is that in both embodiments of the invention, a digit line is coupled to first and second interconnects of memory cell access transistors. The first and second access transistors are linearly arrayed in the first direction. However, the first and second access transistors are not linearly arrayed in the second direction.

As a result of this invention, active areas can be formed closer together due to the absence of dual digit lines in adjacent columns, required for each sense amplifier to read a particular memory cell. The spacing between each digit line is wider than in conventional DRAM architecture. The effect of this wider spacing is a reduction in internal noise, coupling, and a potential reduction in array size. Furthermore, the larger spacing between digit lines eliminates the need to twist digit lines. Pull-up time, pull-down time, and process reliability are not sacrificed in achieving the methods and apparatus of this invention.

BRIEF DESCRIPTION OF THE DRAWINGS

FIG. 6d is a plan view of a single digit line open folded array architecture for a DRAM, having a digit line extending between active areas of a device;

DESCRIPTION OF THE PREFERRED EMBODIMENTS

In the following detailed description of the preferred embodiment, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 5:
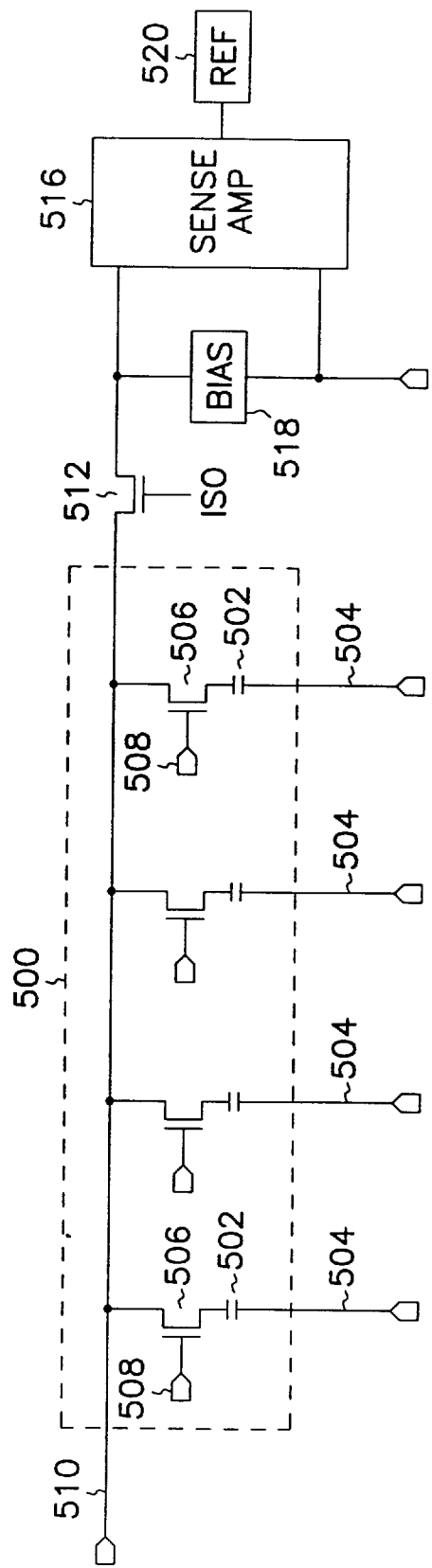
FIG. 5 is a schematic diagram of a single digit line architecture for a DRAM.

This invention replaces digit line pairs in a folded digit line architecture, with a single digit line. FIG. 5 shows a schematic diagram of a single digit line architecture for a DRAM, having one digit line 510, in adjacent columns, per sense amplifier 516. A memory array 500 has a plurality of memory cells 502, which are fabricated as capacitors having one capacitive plate connected to a reference voltage, or to ground, at 504 and the other node connected to an access transistor 506. Each access transistor 506 is a n-type transistor having its gate connected to a word line 508. The reference voltage is typically biased to one-half the power supply voltage (Vcc) by a biasing source, but it can be biased to any predetermined level, including ground (0 Volts).

Each digit line 510 is connected to a line of access transistors 506 and memory cells 502, as shown in FIG. 5. When access transistors 506 are selectively activated, the charge stored on the corresponding memory cell 502 is coupled to the digit line. N-type isolation transistor 512 isolates the memory cell array 500 from the bias circuitry 518 and sense amplifier 516. Bias circuit 518 is used to equalize the nodes of the sense amplifier 516 to the same voltage. A sense amplifier 516 reads the voltage difference between the digit line 510 and reference circuitry 520, to determine the logic of a memory cell 502. Reference 520 can be any reference circuit, including an active supply circuit, a capacitor, or a second digit line, as detailed below.

Figure 1:
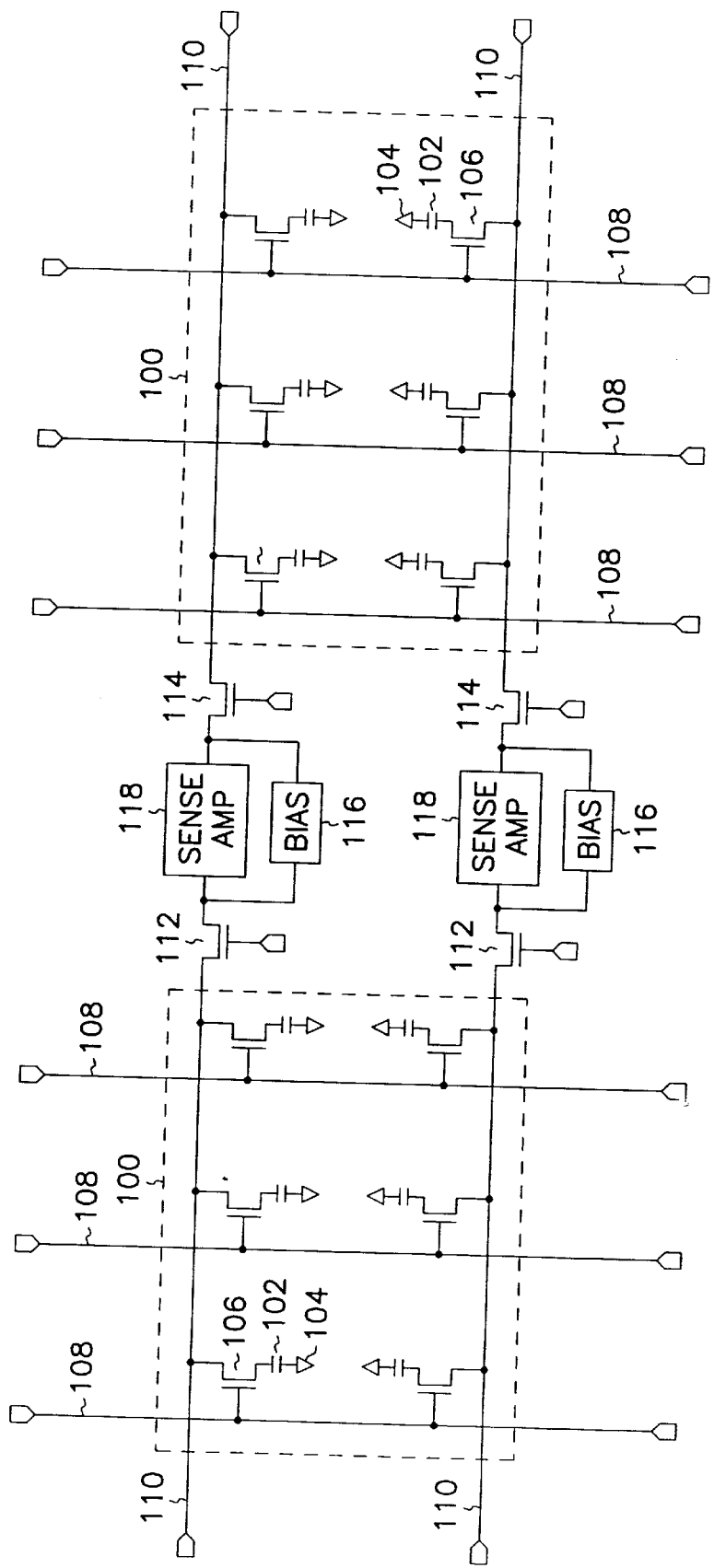
FIG. 1 is a prior art schematic diagram of a dual digit line, open digit line architecture for a dynamic random access memory (DRAM)
Figure 2:
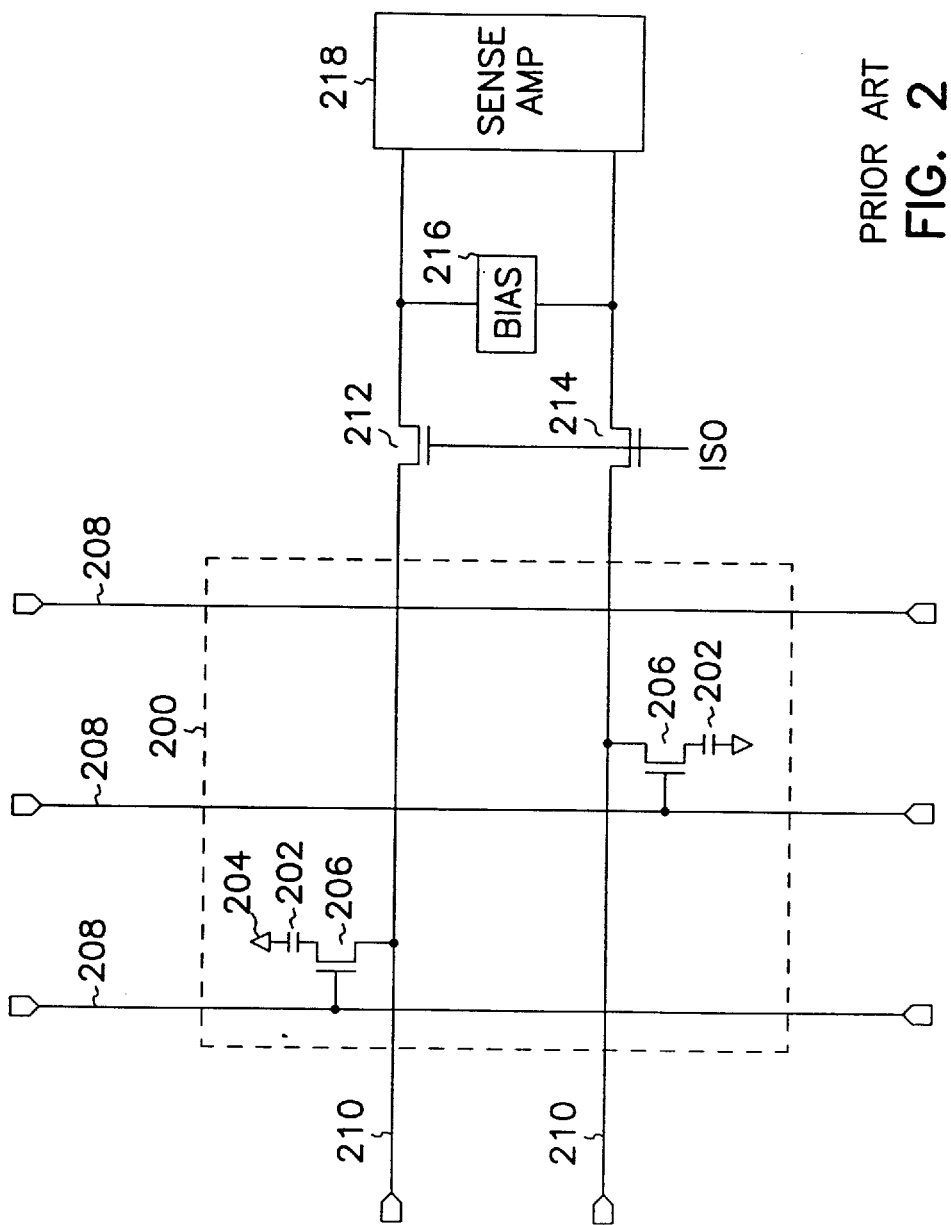
FIG. 2 is a prior art schematic diagram of a dual digit line, folded digit line architecture for a DRAM.
Figure 3:
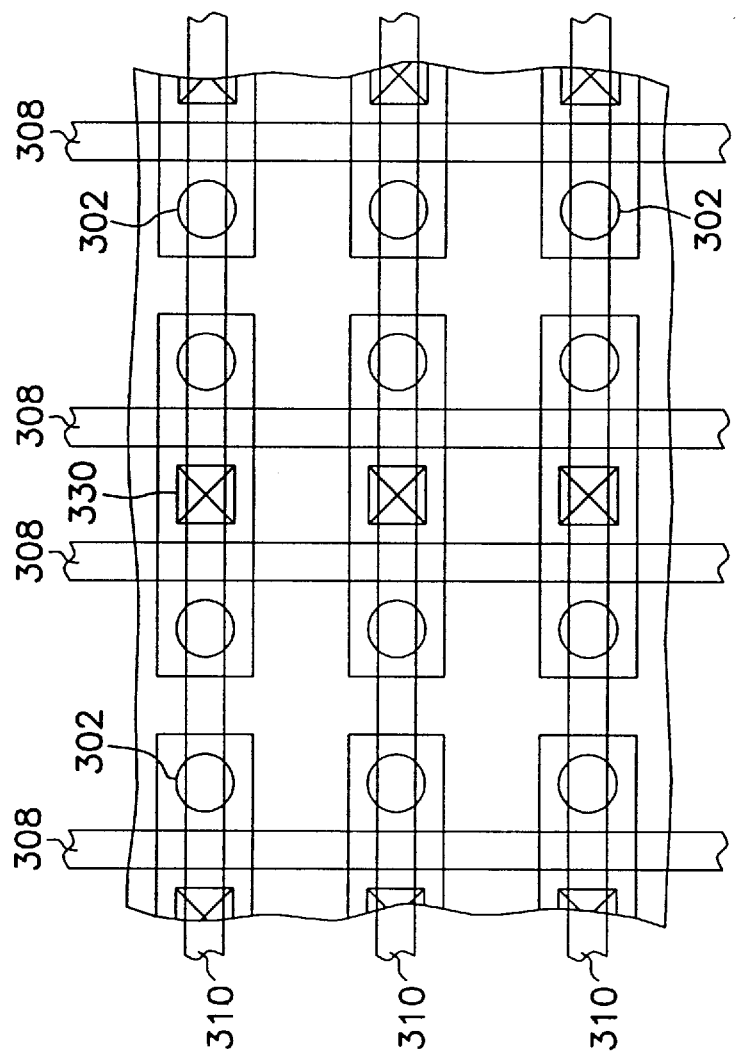
FIG. 3 is a prior art plan view of a dual digit line, open digit line architecture for a DRAM.
Figure 4:
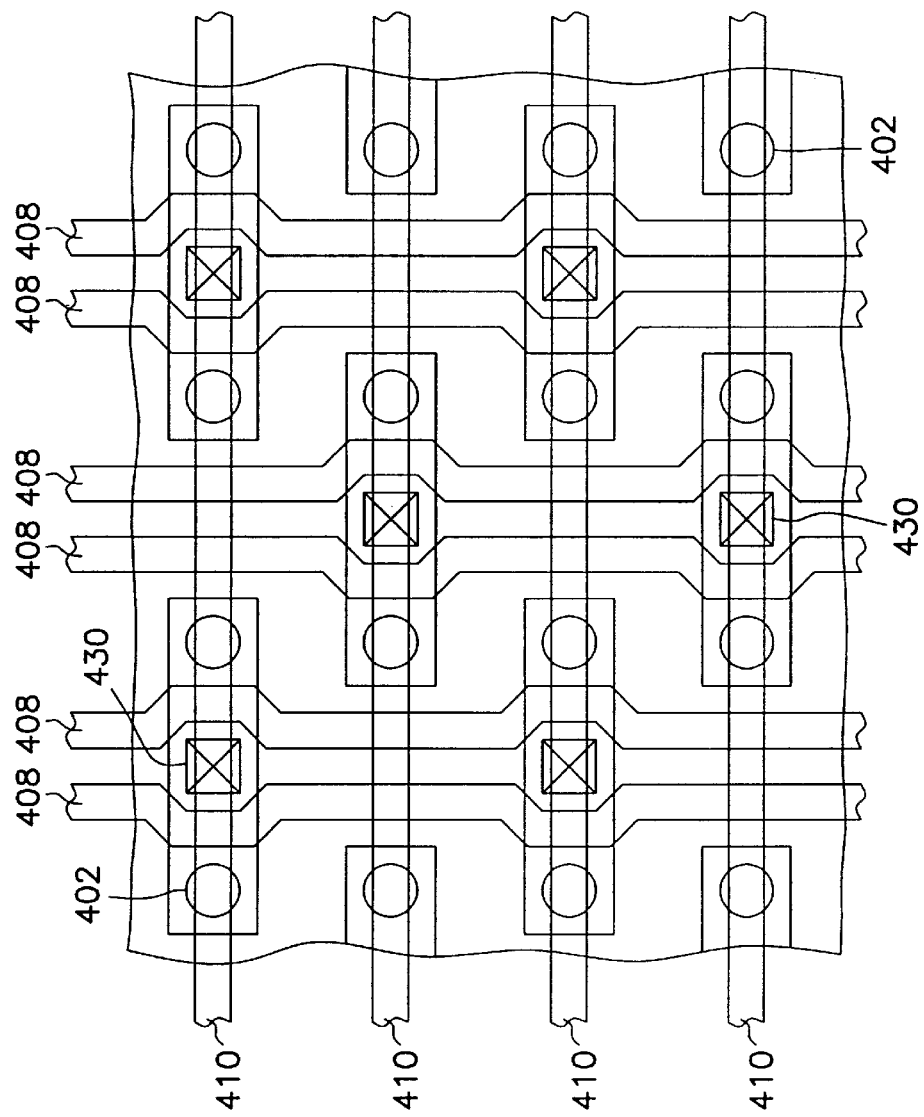
FIG. 4 is a prior art plan view of a dual digit line, folded digit line architecture for a DRAM.

Plan views of a single digit line in a folded digit line architecture, are shown in FIGS. 6a–6d. Field oxide 622 isolates active area 624 components on the die. A memory cell 602 is located at every other intersection between a word line 608 and a digit line 610. The memory cells are fabricated in "columns" illustrated as columns A and B. Each of the columns of memory cells are typically coupled to a separate digit line in a folded digit line architecture, as described above with reference to FIG. 2. However, a single digit line is used in the present invention to communicate with two columns of memory cells. The single digit line 610 consists of a bus line with conductive tabs 632 extending from either side. However, any bus line with conductive tabs 632 extending from either side can be used without departing from the scope of the invention.

Digit lines 610 run perpendicular to the word lines 608. Each digit line is formed in field oxide 622 between adjacent active areas 624. Connections to underlying access transistor source/drain regions are made to the conductive tabs 632. The bus line is formed of titanium, aluminum, or a similar conductive material, as well known to one skilled in the art. The conductive tabs 632 are formed of metal, or polysilicon. The tabs 632 connect underlying access transistor source/drain regions to the digit line 610 at interconnects 630. Interconnects 630 are formed of titanium nitride, having tungsten deposited thereon. However, other contact materials well known to one skilled in the art can be used without departing from the scope of the invention.

Figure 6A:
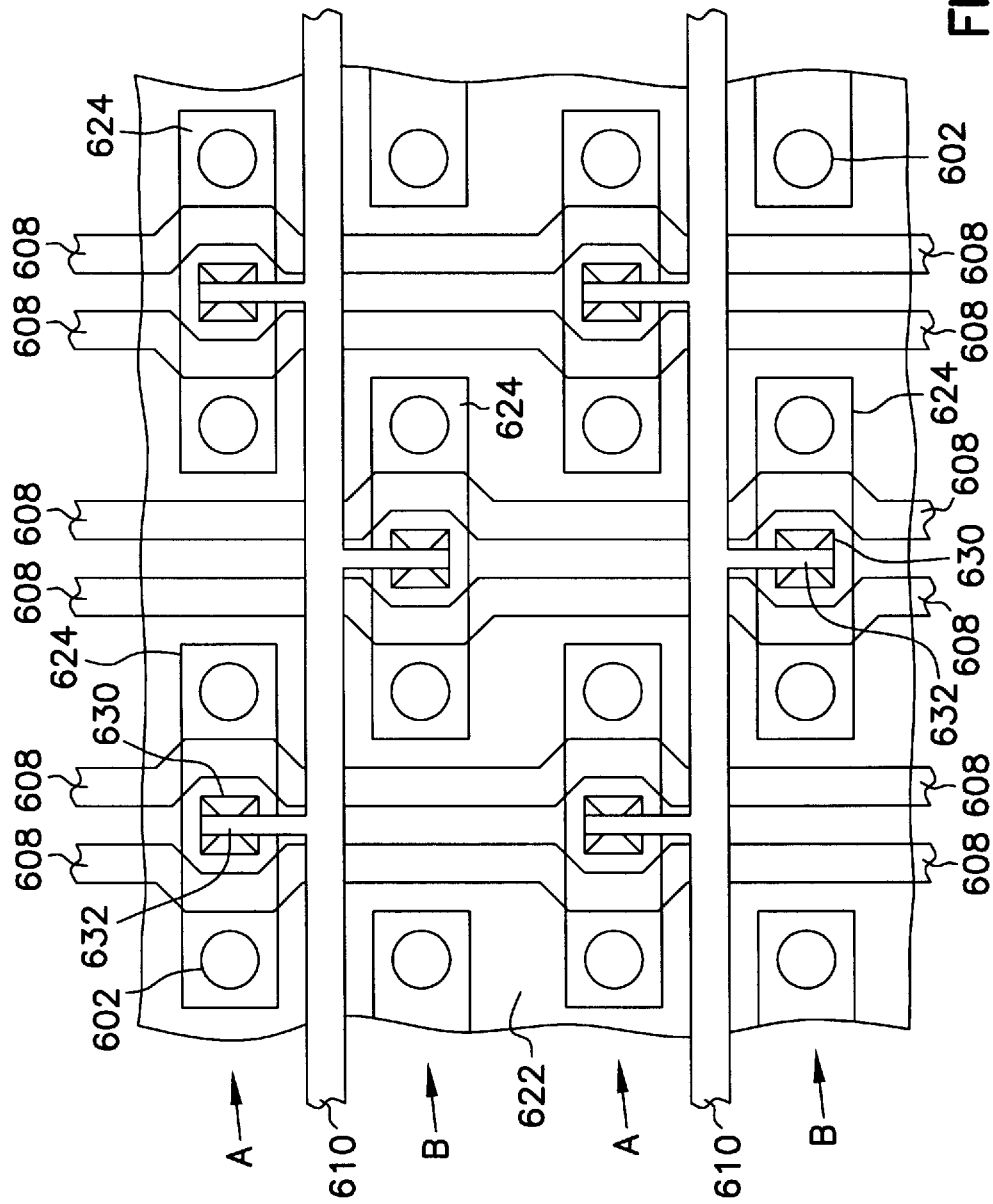
FIG. 6a is a plan view of a single digit line open folded array architecture for a DRAM, having a digit line extending between active areas of a device.

The digit lines 610 are formed, running generally in the "x" direction, such that the spacing between adjacent digit lines 610 in a plan view is four feature spacings, as shown in FIG. 6a. From a reference point of one digit line 610 to an adjacent digit line 610, the feature spacing comprises components of active 624 and poly 622 feature regions. Specifically, the feature spacing components between digit lines 610 consists of ½ poly region 622, 1 active region 624, 1 poly region 622, 1 active region 624, and ½ poly region 622, as shown in FIG. 6a. Memory cells 602 are formed, such that the spacing between adjacent memory cells 602 in the "y" direction in a plan view is two feature spacings. The second direction "y" is orthogonal to the first direction "x" in the plane of the integrated circuit memory. From a reference point of one memory cell 602 to an adjacent memory cell 602 in the "y" direction, the feature spacing consists of ½ active region 624, 1 poly region 622, and ½ active region 624, as shown in FIG. 6a.

Furthermore, each digit line 610 is coupled to first and second interconnects 630 at first and second memory cell 602 access transistors 506. The first and second access transistors 506 are linearly arrayed in the "x" direction. However, the first and second access transistors 506 are not linearly arrayed in the "y" direction.

Figure 6B:
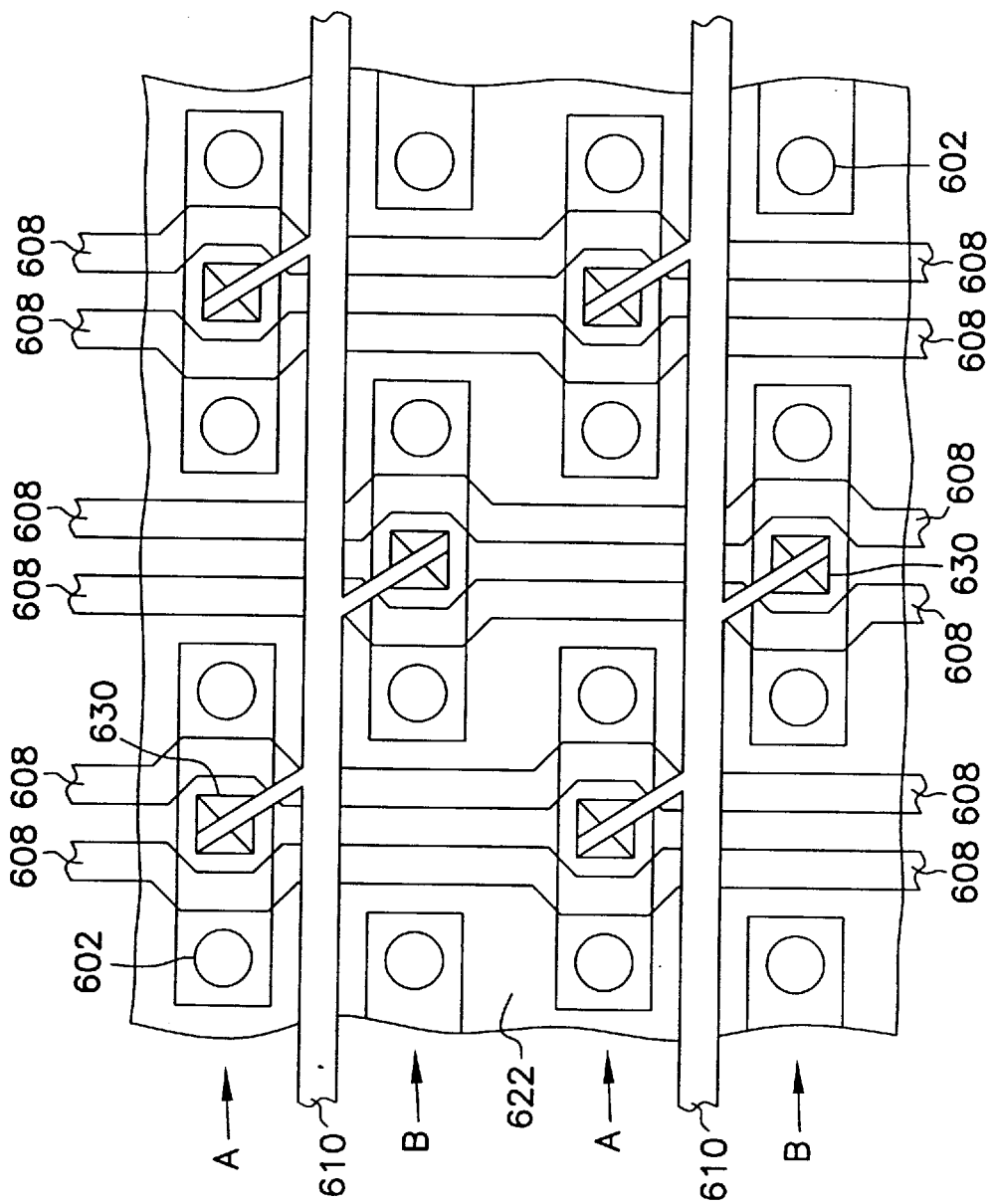
FIG. 6b is a plan views of a single digit line open folded array architecture for a DRAM, having a digit line extending between active areas of a device.
Figure 6C:
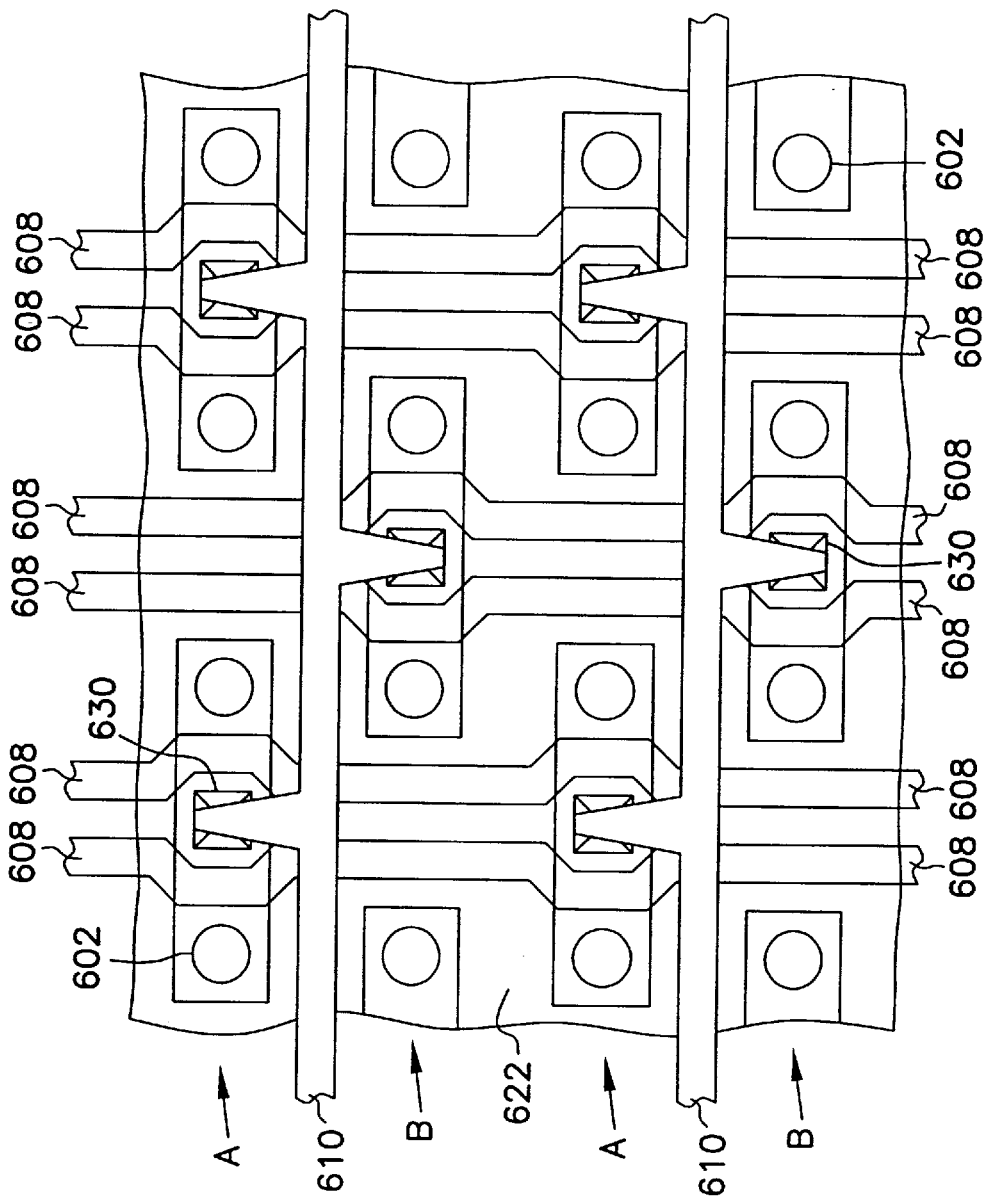
FIG. 6c is a plan view of a single digit line open folded array architecture for a DRAM, having a digit line extending between active areas of a device.

It is to be appreciated that the tabs 632, as shown in FIG. 6a, may be oriented in any shape, or angle, from the digit line 610. In this example, the tabs 632 are orthogonal to, and extending from both sides of, the digit line 610. In further embodiments, as shown in FIG. 6b, the tabs 632 are formed at an angle with respect to the digit line 610. Furthermore, as shown in FIG. 6c, the tabs 632 can be tapered in shape, with two nonparallel sides. Alternatively, as shown in FIG. 6d, the tabs 632 can rounded in shape over the interconnect 630 regions. Other combinations of tab and interconnect shapes can be used to connect the single digit line to two columns of memory cells.

In another embodiment of the invention, as shown in FIGS. 7a–7d, a digit line 710 is formed over active areas 724 of the device. Field oxide 722 isolates active area 724 components on the die. A memory cell 702 is located at every other intersection between a word line 708 and a digit line 710. The memory cells are fabricated in "columns" illustrated as columns A and B. Each of the columns of memory cells are typically coupled to a separate digit line in a folded digit line architecture, as described above with reference to FIG. 2. However, a single digit line is used in the present invention to communicate with two columns of memory cells.

Each digit line 710 consists of a bus line with conductive tabs 732 extending from one of its sides. However, any bus line with conductive tabs 732 extending from one of its sides can be used without departing from the scope of the invention. The bus line is formed of titanium, aluminum, or a similar conductive material, as well known to one skilled in the art. The conductive tabs 732 are formed of metal, or polysilicon.

Figure 7A:
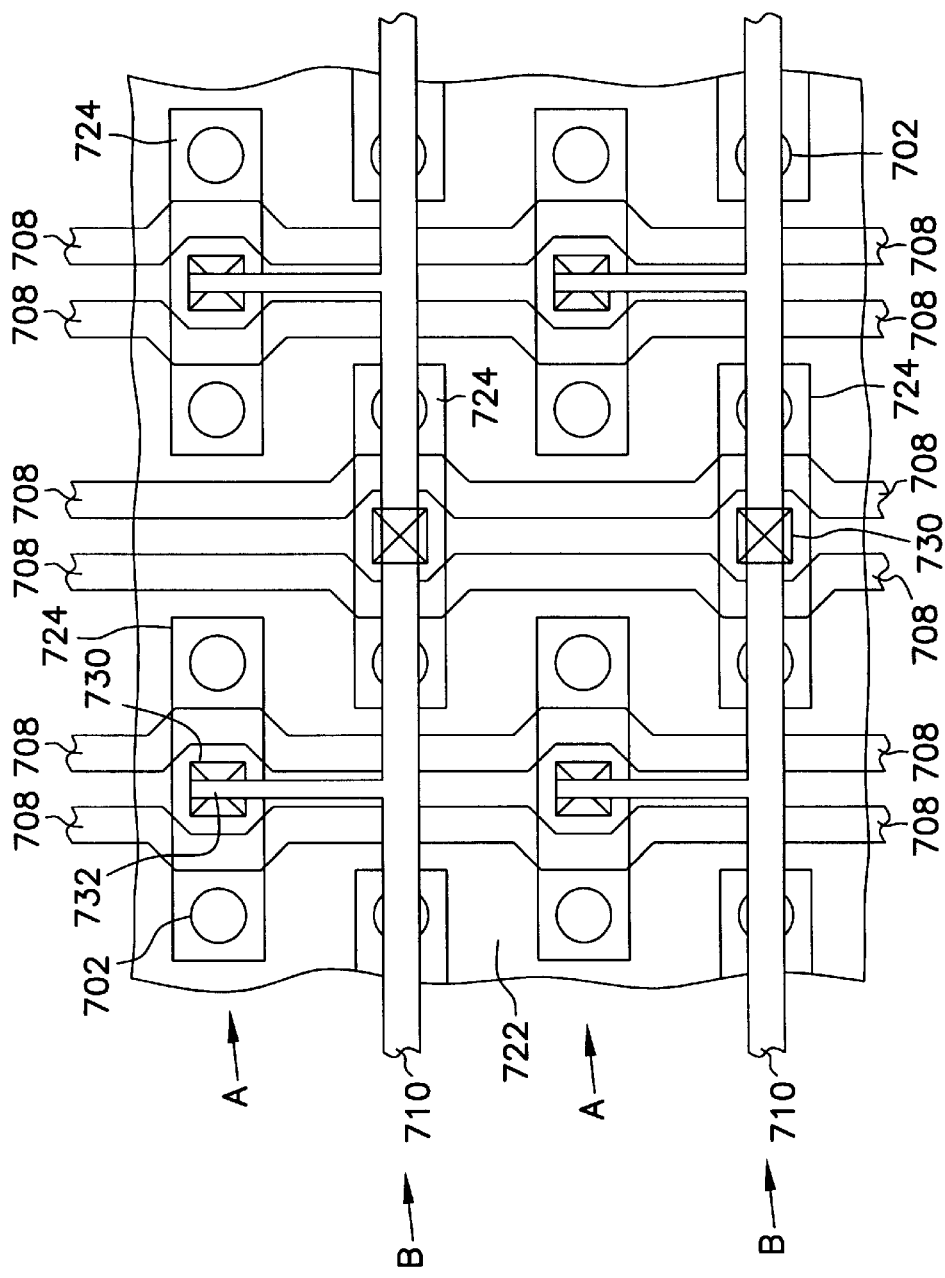
FIG. 7a is a plan view of a single digit line open folded array architecture for a DRAM, having a digit line extending over active areas of a device.

The digit lines 710 are formed, running generally in the "x" direction, such that the spacing between adjacent digit lines 710 in a plan view is four feature spacings, as shown in FIG. 7a. From the middle of a digit line 710 to an adjacent digit line 710, the feature spacing comprises components of active 724 and poly 722 feature regions. Specifically, the feature spacing components between digit lines 710 consists of ½ active region 724, 1 poly region 722, 1 active region 724, 1 poly region 722, and ½ active region 724, as shown in FIG. 7a. Memory cells 702 are formed, such that the spacing between adjacent memory cells 702 in the "y" direction in a plan view is two feature spacings. The second direction "y" is orthogonal to the first direction "x" in the plane of the integrated circuit memory. From the middle of a memory cell 702 to an adjacent memory cell 702 in the "y" direction, the feature spacing consists of ½ active region 724, 1 poly region 722, and ½ active region 724, as shown in FIG. 7a.

Furthermore, each digit line 710 is coupled to first and second interconnects 730 at first and second memory cell 702 access transistors 506. The first and second access transistors 506 are linearly arrayed in the "x" direction. However, the first and second access transistors 506 are not linearly arrayed in the "y" direction.

Figure 7B:
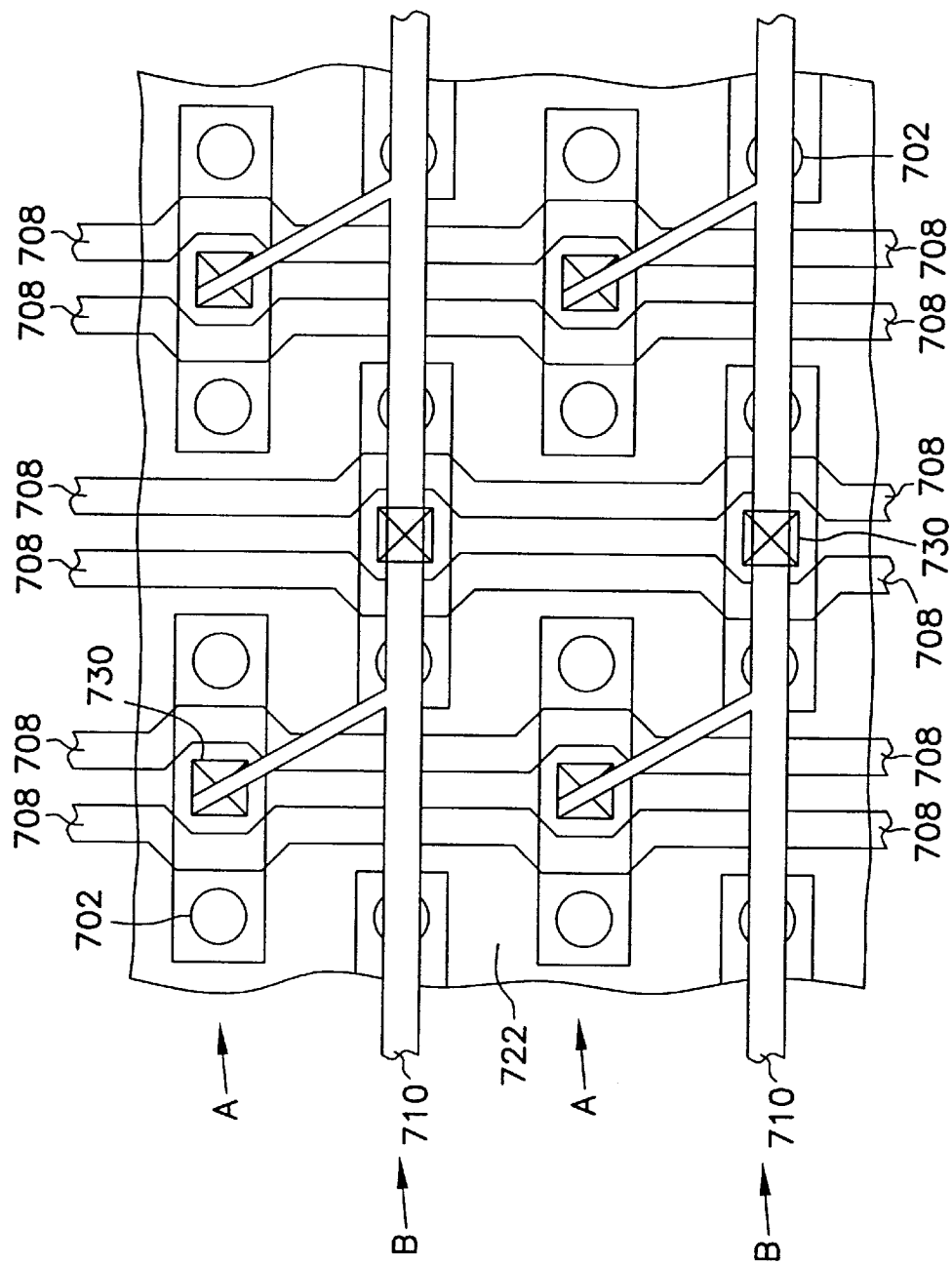
FIG. 7b is a plan view of a single digit line open folded array architecture for a DRAM, having a digit line extending over active areas of a device.
Figure 7C:
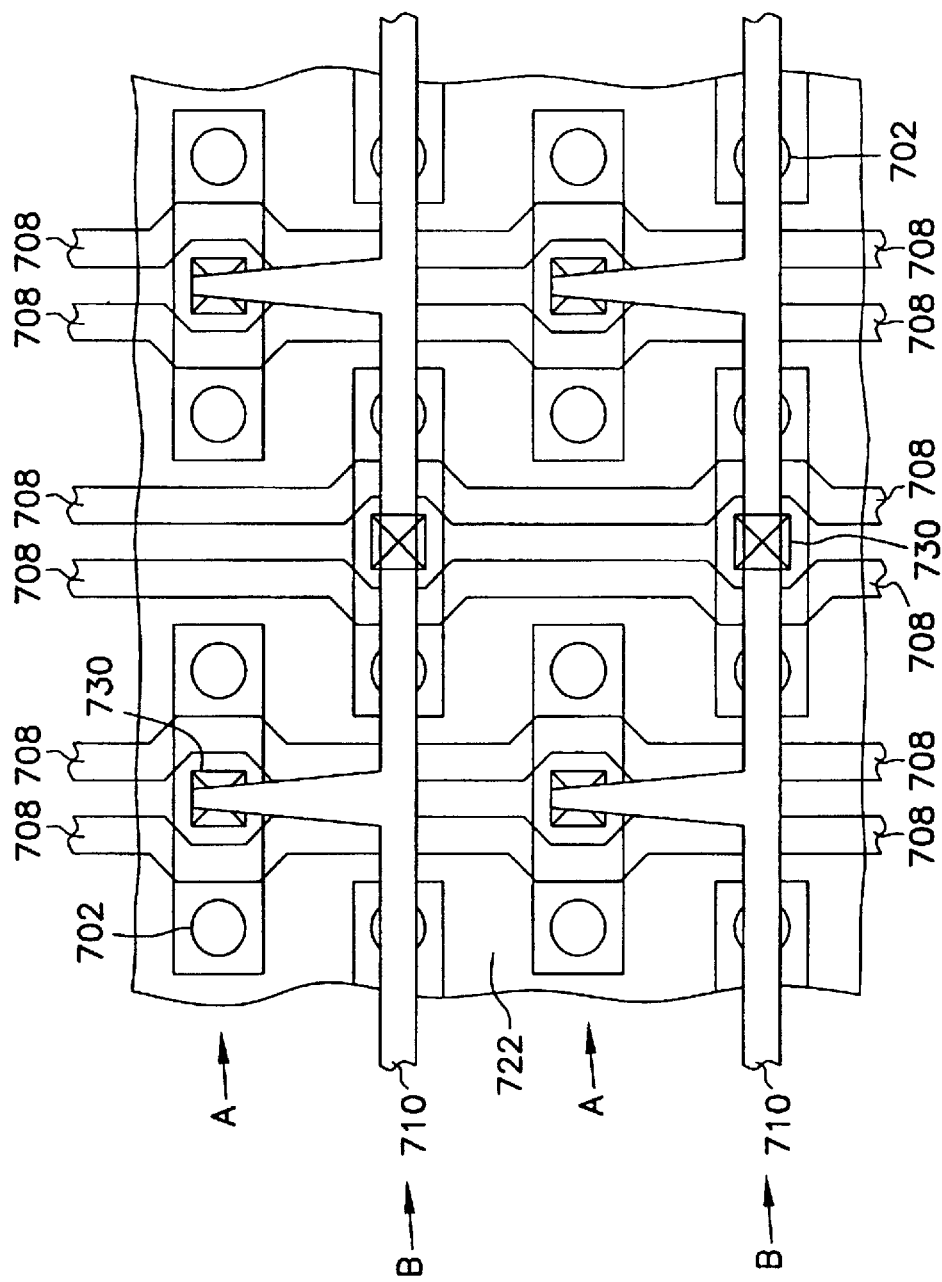
FIG. 7c is a plan view of a single digit line open folded array architecture for a DRAM, having a digit line extending over active areas of a device.
Figure 7D:
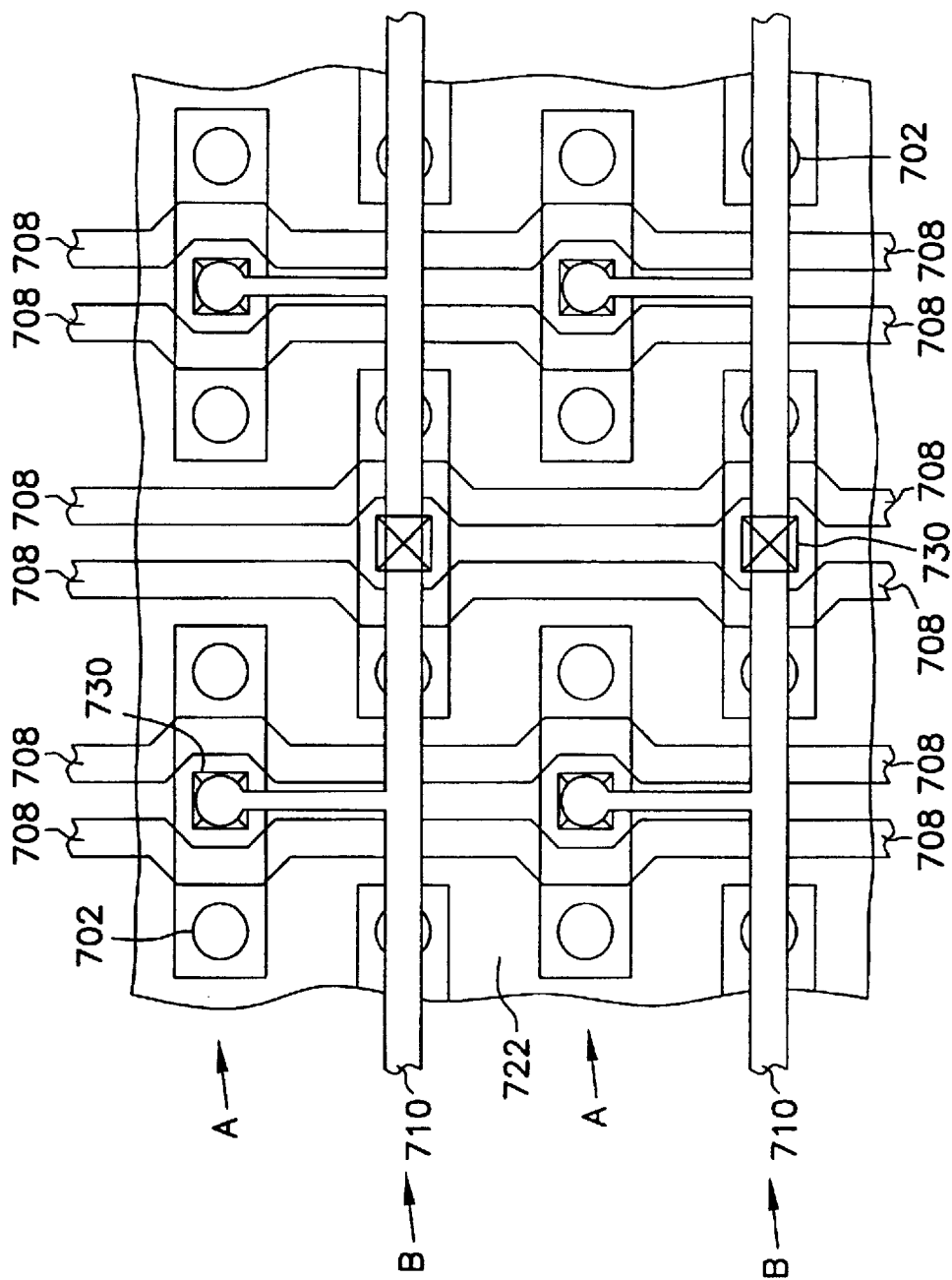
FIG. 7d is a plan view of a single digit line open folded array architecture for a DRAM, having a digit line extending over active areas of a device.

In this example, the tabs 732 are orthogonal to the digit line 710, as shown in FIG. 7a. However, they may be fabricated in other shapes without departing from the scope of the invention. In further embodiments, as shown in FIG. 7b, the tabs 732 are formed at an angle with respect to the digit line 710. Furthermore, as shown in FIG. 7c, the tabs 732 can be tapered in shape, with two nonparallel sides. Alternatively, as shown in FIG. 7d, the tabs 732 can rounded in shape over the interconnect 730 regions.

As shown in FIGS. 7a–7d, the tabs 732 connect underlying access transistor source/drain regions to the digit line 710 at interconnects 730. Interconnects are also coupled to the digit line 710 itself, to connect transistor source/drain regions beneath the digit line 710. Interconnects 730 are formed of titanium nitride, having tungsten deposited thereon. However, other contact materials well known to one skilled in the art can be used without departing from the scope of the invention.

Figure 8:
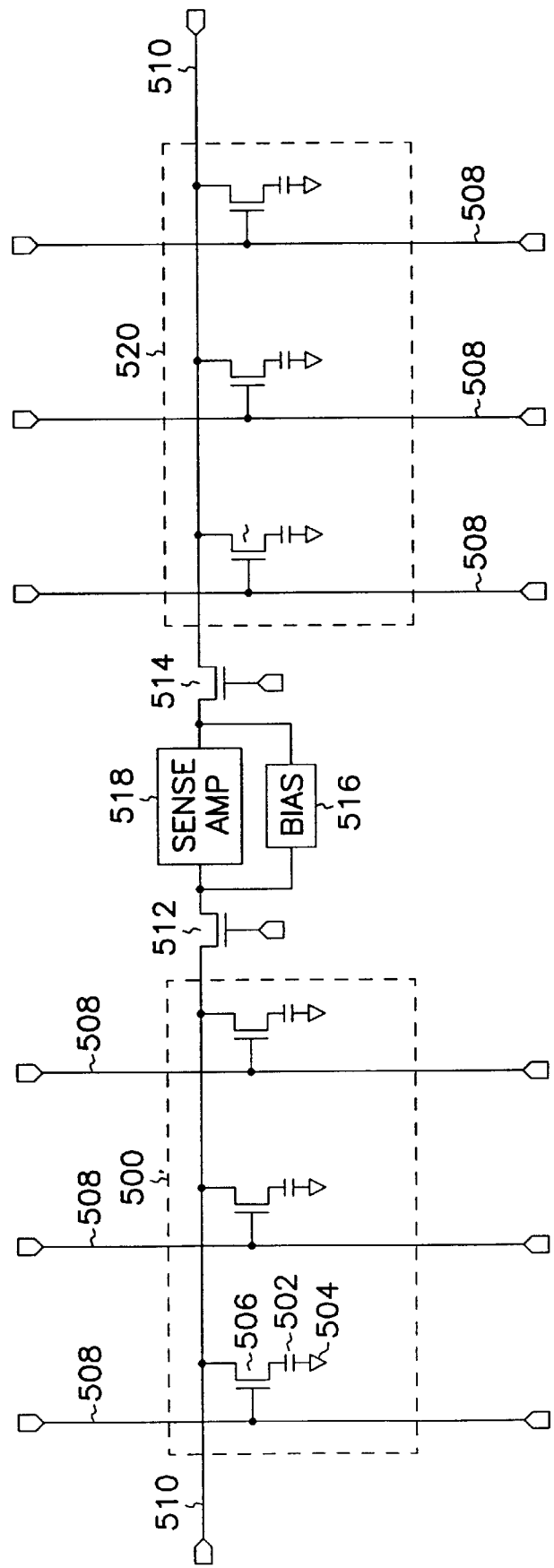
FIG. 8 is a schematic diagram of a single digit line architecture for a DRAM, having a second digit line for a reference.

In another embodiment of the invention, reference 520 is fabricated as a second digit line, as shown by the schematic in FIG. 8. This memory is therefore similar to the open digit line described above. Thus, either digit line can be used as a reference when the other digit line is active. Digit lines for this alternate layout are formed in accordance with those described previously and shown in FIGS. 6a–6d and 7a–7d.

As a result of this invention, active areas 724 can be formed closer together due to the absence of dual digit lines per sense amplifier in adjacent columns. The spacing between each digit line is wider than in conventional DRAM architecture. The effect of this wider spacing is a reduction in internal noise, coupling, and a potential reduction in array size. Furthermore, the larger spacing between digit lines eliminates the need to twist digit lines. Pull-up time, pull-down time, and process reliability are not sacrificed in achieving the methods and apparatus of this invention.

Conclusion

A memory device has been described which includes an array of memory cells fabricated in adjacent columns. A single digit line is coupled to two adjacent columns of memory cells via conductive tabs which extent from the digit line. The digit line can be fabricated between the two memory cell columns and include tabs extending from opposite sides of the digit line. Alternatively, the digit line can be fabricated above one of the two memory cell columns and include tabs extending from only one side of the digit line.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. An integrated circuit memory device comprising:
   a plurality of memory cells fabricated in the integrated circuit memory device;
   a plurality of access transistors, each one of the plurality of access transistors having a source/drain connected to one of the plurality of memory cells and a gate connected to a word line;
   a conductive digit line fabricated in the integrated circuit memory device; and
   a plurality of conductive tabs extending from opposite sides of the digit line, and electrically coupled to a source/drain of the plurality of access transistors.

2. The integrated circuit memory device of claim 1, wherein the conductive tabs comprise metal or polysilicon.

3. The integrated circuit memory device of claim 1, wherein the digit line is fabricated as a layer of metal.

4. The integrated circuit memory device of claim 1, wherein the conductive tabs are orthogonal to the digit line.

5. The integrated circuit memory device of claim 1, wherein the conductive tabs are tapered in shape, with two non-parallel sides.

6. The integrated circuit memory device of claim 1, wherein the conductive tabs are rounded in shape.

7. The integrated circuit memory device of claim 1, wherein the conductive tabs are rectangular in shape.

8. An integrated circuit memory device comprising:
   a plurality of memory cells fabricated in the integrated circuit memory device;
   a plurality of access transistors, each one of the plurality of access transistors having a source/drain connected to one of the plurality of memory cells and a gate connected to a word line;
   a conductive digit line fabricated in the integrated circuit memory device; and
   a plurality of conductive tabs extending from one side of the digit line, and electrically coupled to a source/drain of the plurality of access transistors.

9. The integrated circuit memory device of claim 8, wherein the conductive tabs comprise metal or polysilicon.

10. The integrated circuit memory device of claim 8, wherein the digit line is fabricated as a layer of metal.

11. The integrated circuit memory device of claim 8, wherein the conductive tabs are orthogonal to the digit line.

12. The integrated circuit memory device of claim 8, wherein the conductive tabs are tapered in shape, with two nonparallel sides.

13. The integrated circuit memory device of claim 8, wherein the conductive tabs are rounded in shape.

14. The integrated circuit memory device of claim 8, wherein the conductive tabs are rectangular in shape.

15. An integrated memory device comprising:

an array of memory cells fabricated in adjacent columns;

access transistors connected to the memory cells;

word lines connected to the access transistors for selectively coupling the memory cells to a single digit line; and the single digit line having a plurality of conductive tabs extending from the single digit line and connecting to at least one of the columns of memory cells.

16. The integrated memory device of claim 15 wherein the plurality of conductive tabs extend from opposite sides of the single digit line to connect to the adjacent columns of memory cells.

17. The integrated memory device of claim 16 wherein the conductive tabs extend substantially orthogonally from the single digit line.

18. The integrated memory device of claim 15 wherein the single digit line is fabricated above a first one of the adjacent column of memory cells, the plurality of conductive tabs extend from one side of the single digit line to connect to a second one of the adjacent columns of memory cells.

19. An integrated circuit memory device comprising:

a plurality of memory cells fabricated in the integrated circuit memory device, such that spacing between adjacent memory cells in a first direction is N distance;

a plurality of access transistors, each one of the plurality of access transistors having a source/drain connected to one of the plurality of memory cells and a gate connected to a word line;

a plurality of conductive digit lines fabricated in the integrated circuit memory device in a second direction, wherein the second direction is orthogonal to the first direction and spacing between adjacent digit lines in the first direction is 2×N Distance; and a plurality of conductive tabs extending from at least one side of the digit line, wherein the conductive tabs are electrically coupled to a source/drain of the plurality of access transistors.

20. An integrated circuit memory device comprising:

a plurality of memory cells fabricated in the integrated circuit memory device in a plurality of columns, such that memory cells of each column are linearly arrayed, and memory cells of adjacent columns are nonlinearly arrayed;

a plurality of access transistors, each one of the plurality of access transistors having a source/drain connected to one of the plurality of memory cells and a gate connected to a word line; and a conductive digit line fabricated in the integrated circuit memory device and coupled to the plurality of columns, the conductive digit line having a plurality of conductive tabs extending from at least one side of the digit line.

\* \* \* \* \*